United States Patent
Jenkins et al.

(10) Patent No.: US 9,158,366 B1
(45) Date of Patent: Oct. 13, 2015

(54) THERMAL CONTROL OF A STORAGE DEVICE RECEIVING A LIMITED AMOUNT OF POWER

(71) Applicant: Western Digital Technologies, Inc., Irvine, CA (US)

(72) Inventors: Dean M. Jenkins, La Canada-Flintridge, CA (US); Robert H. Krebs, Jr., San Juan Capistrano, CA (US)

(73) Assignee: Western Digital Technologies, Inc., Irvine, CA (US)

( * ) Notice: Subject to any disclaimer, the term of this patent is extended or adjusted under 35 U.S.C. 154(b) by 324 days.

(21) Appl. No.: 13/829,955

(22) Filed: Mar. 14, 2013

(51) Int. Cl.
*G06F 1/26* (2006.01)
*G06F 1/32* (2006.01)
*G11B 33/14* (2006.01)
*H01L 31/052* (2014.01)
*G11B 19/28* (2006.01)
*G06F 1/20* (2006.01)
*G11B 19/04* (2006.01)

(52) U.S. Cl.
CPC .............. *G06F 1/3268* (2013.01); *G06F 1/206* (2013.01); *G06F 2200/201* (2013.01); *G11B 19/046* (2013.01); *G11B 19/28* (2013.01); *G11B 33/144* (2013.01); *H01L 31/0521* (2013.01)

(58) Field of Classification Search
CPC . G06F 1/206; G06F 2200/201; H01L 31/024; H01L 31/0521; G11B 19/046; G11B 19/28; G11B 33/144

USPC .................................. 713/300, 320, 323, 340
See application file for complete search history.

(56) References Cited

U.S. PATENT DOCUMENTS

| | | | |
|---|---|---|---|
| 7,080,201 B2 | 7/2006 | Suzuki et al. | |
| 7,206,201 B2 | 4/2007 | Behl et al. | |
| 7,343,500 B2 | 3/2008 | Igari | |
| 7,621,460 B2 | 11/2009 | Dorr | |
| RE41,514 E | 8/2010 | Behl | |
| 7,983,539 B2 | 7/2011 | Pan | |
| 8,151,046 B2 | 4/2012 | Suzuki et al. | |
| 8,205,048 B2 | 6/2012 | Muramatsu et al. | |
| 2002/0051338 A1 | 5/2002 | Jiang et al. | |
| 2007/0073825 A1* | 3/2007 | Suzuki et al. ................. | 709/212 |
| 2008/0094741 A1* | 4/2008 | Yoshida ......................... | 360/31 |
| 2011/0231030 A1 | 9/2011 | Carter et al. | |
| 2012/0140402 A1 | 6/2012 | Mizumura et al. | |

* cited by examiner

Primary Examiner — Michael J Brown

(57) ABSTRACT

An electronic device including a thermal reduction device, and a storage device electrically connected to the thermal reduction device. The storage device including a media, a channel configured to perform data operations on the media, a power input interface configured to receive power for consumption by the storage device from an available average amount of power, wherein the received power reduces the available average amount of power, and the available average amount of power is no greater than a maximum average power threshold, a thermal sensor configured to generate thermal data corresponding to a temperature of the storage device, and a thermal control unit configured to activate or deactivate a power savings mode for the storage device based at least on the thermal data, and to activate or deactivate the thermal reduction device based at least on the thermal data. The power savings mode affects an operation of the channel.

20 Claims, 3 Drawing Sheets

THERMAL CONTROL OF A STORAGE DEVICE RECEIVING A LIMITED AMOUNT OF POWER

BACKGROUND

In a conventional disk drive, the conventional disk drive may become damaged if the temperature of the conventional disk drive is too high for too long of a period. Thus, the conventional disk drive may monitor the temperature of the conventional disk drive and implement cooling measures to reduce the temperature of the conventional disk drive when the conventional disk drive determines that the temperature of the conventional disk drive is too high. However, such cooling measures generally require a large amount of time to reduce the temperature of the conventional disk drive. In addition, the cooling measures typically reduce a performance of the conventional disk drive. Thus, the conventional disk drive may have a reduced performance for a large amount of time when the cooling measure is implemented to reduce the temperature of the conventional disk drive.

The conventional disk drive may also be cooled by a fan in a conventional computer. However, the fan is controlled by another device aside from the conventional disk drive. The device may turn on the fan when the fan is not needed to cool the conventional disk drive. Furthermore, the device may not turn on the fan fast enough to cool the conventional disk drive. Thus, the conventional disk drive may not be appropriately cooled by the fan. In addition, the fan generally draws additional power, which may increase a power consumption of the conventional computer. The increased power consumption of the conventional computer may be undesirable.

BRIEF DESCRIPTION OF THE DRAWINGS

The features and advantages of the present embodiments will become more apparent from the detailed description set forth below when taken in conjunction with the drawings, wherein.

DETAILED DESCRIPTION

Figure 1:
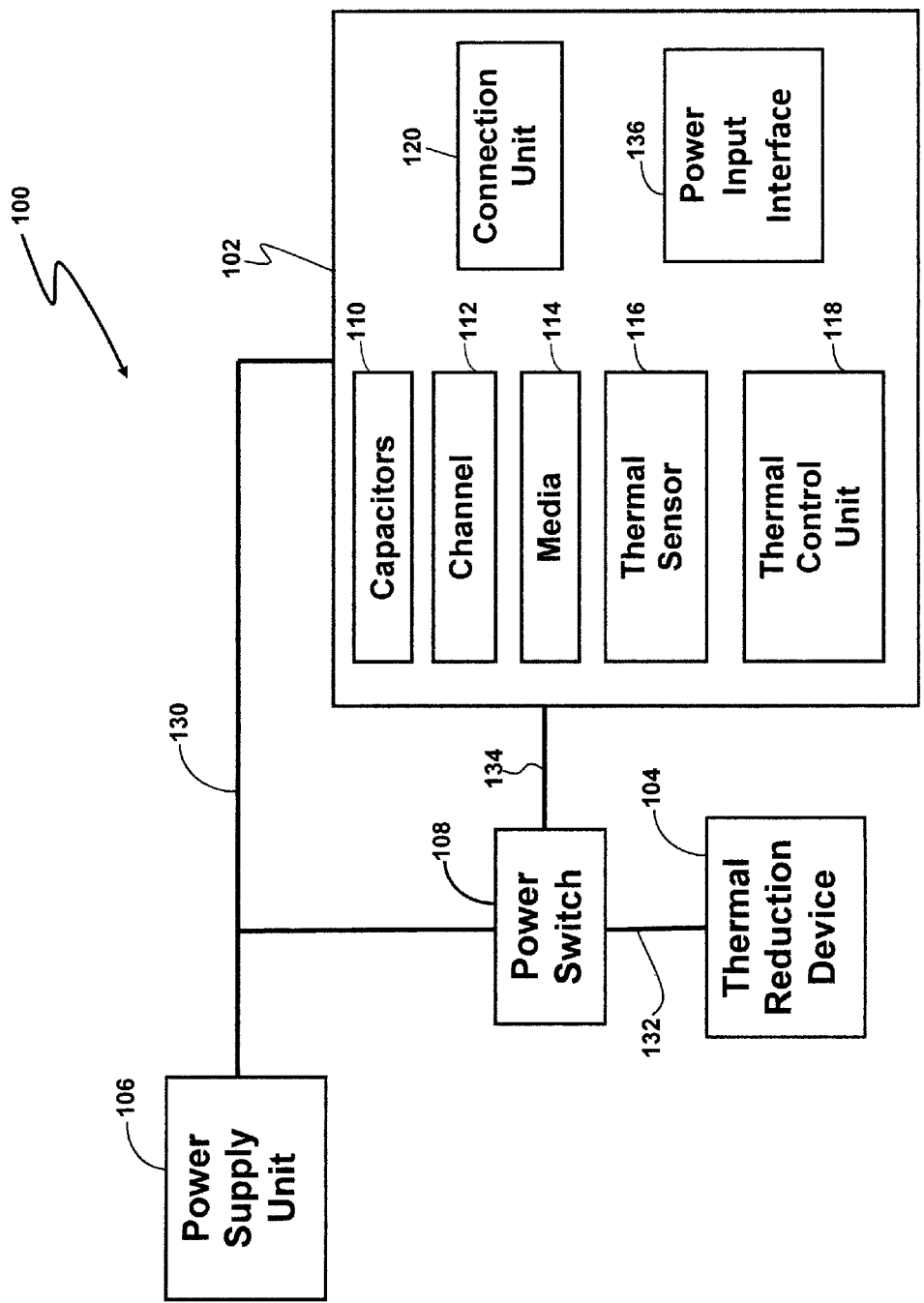
FIG. 1 is a box diagram of an electronic device comprising a storage device and a thermal reduction device according to an embodiment.

In an embodiment shown in FIG. 1, an electronic device 100 comprises a storage device 102, a thermal reduction device 104, a power supply unit 106, and a power switch 108. In an embodiment, the electronic device 100 comprises a computer, a laptop, a tablet, a media streaming unit, a set top box, a watch, or other device which utilizes a storage device 102 which needs to be cooled. In an embodiment, the power supply unit 106 supplies a limited average amount of power to the storage device 102 and the thermal reduction device 104. In an embodiment, the storage device 102 is electrically connected to the thermal reduction device 104.

In an embodiment, the limited average amount of power comprises an available average amount of power for the storage device 102 and the thermal reduction device 104. That is, when the storage device 102 consumes power, it reduces the available average amount of power such that there is less power available for the thermal reduction device 104. Similarly, when the thermal reduction device 104 consumes power, it reduces the available average amount of power such that there is less power available for the storage device 102. In an embodiment, the available average amount of power is no greater than a maximum average power threshold.

In an embodiment, the storage device 102 is configured to activate or deactivate the thermal reduction device 104, which will be described in more detail below.

In an embodiment, the storage device 102 comprises capacitors 110, a channel 112, a media 114, a thermal sensor 116, a thermal control unit 118, a connection unit 120, and a power input interface 136. In an embodiment, the storage device 102 receives power from the power input interface 136. The power input interface 136 can, for example, be configured to receive power for consumption by the storage device 102 from the available average amount of power supplied by the power supply unit 106. In an embodiment, the power input interface 136 receives power from the power supply unit 106 using a power line 130. In an embodiment, the capacitors 110 are configured to reduce peak power usage by the storage device 102 and can be connected to the power input interface 136.

For example, the storage device 102 may utilize instant power that may oscillate, or rapidly increase or decrease even when the average amount of power used by the storage device 102 remains relatively constant. The capacitors 110 can act as a reservoir of power such that when the storage device 102 suddenly requires a large amount of instant power for a short period of time, the capacitors 110 can supply some or all of the power to the storage device 102. This can smooth out the instant power drawn by the storage device 102 from the power supply unit 106 as the capacitors 110 can be recharged at different times or even for a longer period of time. For example, the capacitors 110 can be charged when the storage device 102 suddenly requires a low amount of instant power for a short period of time. Thus, the instant power drawn by the storage device 102 from the power supply unit 106 can be closer to the average amount of power used by the storage device 102, which reduces the peak power usage by the storage device 102.

In an embodiment, the channel 112 is configured to perform data operations on the media 114. In an embodiment, the data operations comprises read or write operations. In an embodiment, the media 114 comprises a magnetic rotating disk. In an embodiment, the media 114 comprises a solid state memory. In an embodiment, the media 114 comprises at least one of a magnetic rotating disk and a solid state memory. In an embodiment, the media 114 comprises both the magnetic rotating disk and the solid state memory.

While the description herein refers to solid state memory generally, it is understood that solid state memory may comprise one or more of various types of solid state non-volatile memory devices such as flash integrated circuits, Chalcogenide RAM (C-RAM), Phase Change Memory (PC-RAM or PRAM), Programmable Metallization Cell RAM (PMC-RAM or PMCm), Ovonic Unified Memory (OUM), Resistance RAM (RRAM), NAND memory (e.g., single-level cell (SLC) memory, multi-level cell (MLC) memory, or any combination thereof), NOR memory, EEPROM, Ferroelectric Memory (FeRAM), Magnetoresistive RAM (MRAM), other discrete NVM (non-volatile memory) chips, or any combination thereof.

The thermal sensor 116 can, for example, be configured to generate thermal data corresponding to a temperature of the storage device 102. In an embodiment, the thermal sensor 116 comprises a thermometer. In an embodiment, the thermal control unit 118 is configured to receive the thermal data from the thermal sensor 116. The thermal control unit 118 can, for example, be configured to control operations of the storage device 102 and the thermal reduction device 104 based on the thermal data. In an embodiment, the thermal control unit 118 is configured to activate the power savings mode and the thermal reduction device 104 in order to reduce the temperature of the storage device 102 and prevent the storage device 102 from overheating.

For example, in an embodiment, the thermal control unit 118 is configured activate or deactivate a power savings mode for the storage device 102 based at least on the thermal data, which will be described in more detail below. In an embodiment, the power savings mode reduces average power consumption of the storage device 102 in order to reduce a temperature of the storage device 102.

In an embodiment, the power savings mode reduces average power consumption of the storage device 102 by affecting an operation of the channel 112. For example, when the power savings mode is deactivated, the channel 112 is configured to perform a first average amount of data operations on the media 114. However, when the power savings mode is activated, the channel 112 is configured to perform a second average amount of data operations on the media 114. In an embodiment, the second average amount of data operations is less than the first average amount of data operations. In an embodiment, the reduction in average amount of data operations performed by the channel 112 on the media 114 reduces average power consumption by the storage device 102.

In an embodiment, the second average amount of data operations is based on an average amount of power consumed by the thermal reduction device 104. For example, the channel 112 can be configured to reduce the average amount of data operations on the media 114, and reduce power consumption of the storage device 102 such that the available amount of power is sufficient to power the thermal reduction device 104.

In an embodiment, the reduction in average amount of data operations performed by the channel 112 can be based on a type of the media 114. For example, the channel 112 can be configured to skip revolutions of the media 114 during a write operation when the media 114 is a magnetic rotating disk. Similarly, the channel 112 can be configured to reduce a data write rate on the media 114 when the media 114 is a solid state memory. In an embodiment, additional types of reductions in average amount of data operations may be utilized which may be appropriate for the type of media 114 in the storage device 102.

The thermal control unit 118 can also be configured to activate or deactivate the thermal reduction device 104 based on the thermal data, which will be described in more detail below. In an embodiment, the thermal reduction device 104 is configured to reduce a temperature of the storage device 102. In an embodiment, the thermal reduction device 104 comprises a fan, an active cooling device, a pump, a Peltier cooler, a thermoelectric cooler, or other type of device which can be used to reduce a temperature of the storage device 102 and which can be powered by power from the power supply unit 106.

In an embodiment, the thermal control unit 118 activates or deactivates the thermal reduction device 104 using the power switch 108. The power switch 108 is electrically connected to the thermal reduction device 104 by a power line 132. The power switch 108 is also electrically connected to the power supply unit 106 by the power line 130. The power switch 108 is configured to allow or cut off power to the thermal reduction device 104 from the power supply unit 106.

In an embodiment, the power switch 108 comprises a transistor such as a field electric transistor. In an embodiment, the power switch 108 comprises a relay. In an embodiment, the power switch 108 comprises a device which is configured to selectively allow or cut off power to the thermal reduction device 104 from the power supply unit 106.

In an embodiment, the thermal control unit 118 transmits a signal to the power switch 108 using the connection unit 120 to activate or deactivate the thermal reduction device 104. In an embodiment, the connection unit 120 is connected to the power switch 108 by a signal line 134.

In an embodiment the connection unit 120 comprises an external pin on the storage device 102 and the signal to the power switch 108 is transmitted using the external pin. In an embodiment, the connection unit 120 comprises a light-emitting diode (LED) pin and the signal to the power switch 108 is transmitted using the LED pin. In an embodiment, the connection unit 120 comprises a pin which is not otherwise being utilized by the storage device 102 and the signal to the power switch 108 is transmitted using the pin which is not otherwise being utilized by the storage device 102. In an embodiment, the connection unit 120 comprises a pin from a Serial ATA (SATA) connector and the signal to the power switch 108 is transmitted using the pin from the SATA connector.

When the thermal control unit 118 activates the thermal reduction device 104, the thermal control unit 118 can control the power switch 108 to allow power to the thermal reduction device 104. For example, the power switch 108 can allow power from the power supply unit 106 to reach the thermal reduction device 104. However, when the thermal control unit 118 deactivates the thermal reduction device 104, the thermal control unit 118 can control the power switch 108 to cut off power to the thermal reduction device 104. For example, the power switch can prevent power from the power supply unit 106 from reaching the thermal reduction device 104.

In an embodiment, when the power savings mode is deactivated, the storage device 102 is configured to consume an average amount of power such that the available average amount of power from the power supply unit 106 is insufficient to operate the thermal reduction device 104. In an embodiment, when the power savings mode is activated, the storage device is configured to consume a reduced average amount of power such that the available average amount of power from the power supply unit 106 is sufficient to operate the thermal reduction device 104.

Furthermore, in an embodiment, when the power savings mode is deactivated, the storage device 102 is configured to consume a first average amount of power. However, when the power savings mode is activated, the storage device 102 is configured to consume a second average amount of power, wherein the second average amount of power is less than the first average amount of power. Furthermore, when activated, the thermal reduction device 104 is configured to consume a third average amount of power. In an embodiment, the sum of the second average amount of power and the third average amount of power is no greater than the first average amount of power.

Figure 2:
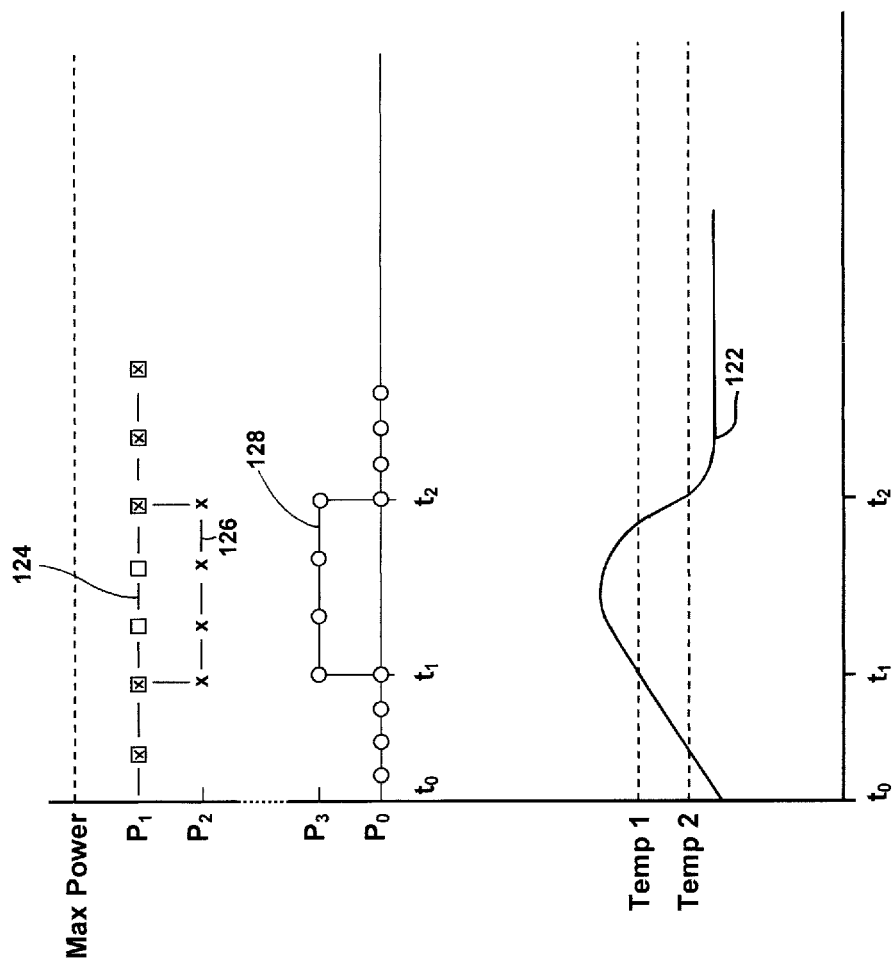
FIG. 2 depicts a graph indicating thermal data, and a graph indicating average power consumption of a storage device and average power consumption of a thermal reduction device, according to an embodiment.

For example, in an embodiment shown in FIG. 2, a graph indicating the thermal data, and a graph indicating average power consumption of the storage device 102 and average power consumption of the thermal reduction device 104, are shown. As seen in the embodiment in FIG. 2, a line 122 represents the thermal data generated by the thermal sensor 116, a line 126 represents an average amount of power consumed by the storage device 102, a line 128 represents an average amount of power consumed by the thermal reduction device 104, and a line 124 represents a sum of the average amount of power consumed by the storage device 102 and the average amount of power consumed by the thermal reduction device 104. Furthermore, the maximum average power threshold is represented by Max Power in the embodiment shown in FIG. 2.

At a time t0, the temperature of the storage device 102 is less than a predetermined activation temperature threshold Temp 1. The predetermined activation temperature threshold Temp 1 indicates a temperature at which the storage device 102 is generating too much heat or is too hot. Thus, the storage device 102 should begin reducing the temperature of the storage device 102. At the time t0, the thermal control unit 118 deactivates or maintains a deactivation of the thermal reduction device 104, and thus the thermal reduction device consumes no or little power, as indicated by the average power level $P_0$. Similarly, the thermal control unit 118 deactivates or maintains a deactivation the power savings mode, and thus the storage device 102 consumes a relatively normal average amount of power, as indicated by the average power level $P_1$. A sum of the average power consumed by the storage device 102 and the thermal reduction device 104 is also indicated by the average power level $P_1$ since the thermal reduction device 104 consumes no or little power.

At a time t1, the temperature of the storage device 102 has risen and is now equal to the predetermined activation temperature threshold Tempt. Thus, the storage device 102 should begin reducing the temperature of the storage device 102. In an embodiment, the thermal control unit 118 reduces the temperature of the storage device 102 by activating the power savings mode and the thermal reduction device 104. In an embodiment, when the power savings mode is activated, the average power consumed by the storage device 102 drops to the average power level $P_2$. This reduction in average power consumed by the storage device 102 can be used to power the thermal reduction device 104. Thus, in an embodiment, when the thermal reduction device 104 is activated, the average power consumed by the thermal reduction device 104 increases to the average power level $P_3$.

In an embodiment, the thermal control unit 118 activates the thermal reduction device 104 when the power saving mode is activated. In an embodiment, the thermal control unit 118 activates the thermal reduction device 104 only after the power savings mode is activated and the average power consumed by the storage device 102 is sufficiently reduced to power the thermal reduction device 104.

At a time t2 the thermal of the storage device 102 has dropped and is now equal to a predetermined deactivation temperature threshold Temp 2. The predetermined deactivation temperature threshold Temp 2 indicates a temperature at which the storage device 102 has sufficiently reduced its generation of heat or is sufficiently cooled. Thus, the storage device 102 does not need to reduce the temperature of the storage device 102 anymore. In an embodiment, the thermal control unit 118 deactivates the power savings mode and the thermal reduction device 104. In an embodiment, when the thermal reduction device 104 is deactivated, the average power consumed by the thermal reduction device 104 decreases to the average power level $P_0$. This reduction in average power consumed by the thermal reduction device 104 can be used to power the storage device 102 such that the power savings mode in the storage device 102 can be deactivated. In an embodiment, when the power savings mode is deactivated, the average power consumed by the storage device 102 increases back to the average power level $P_1$.

Figure 3:
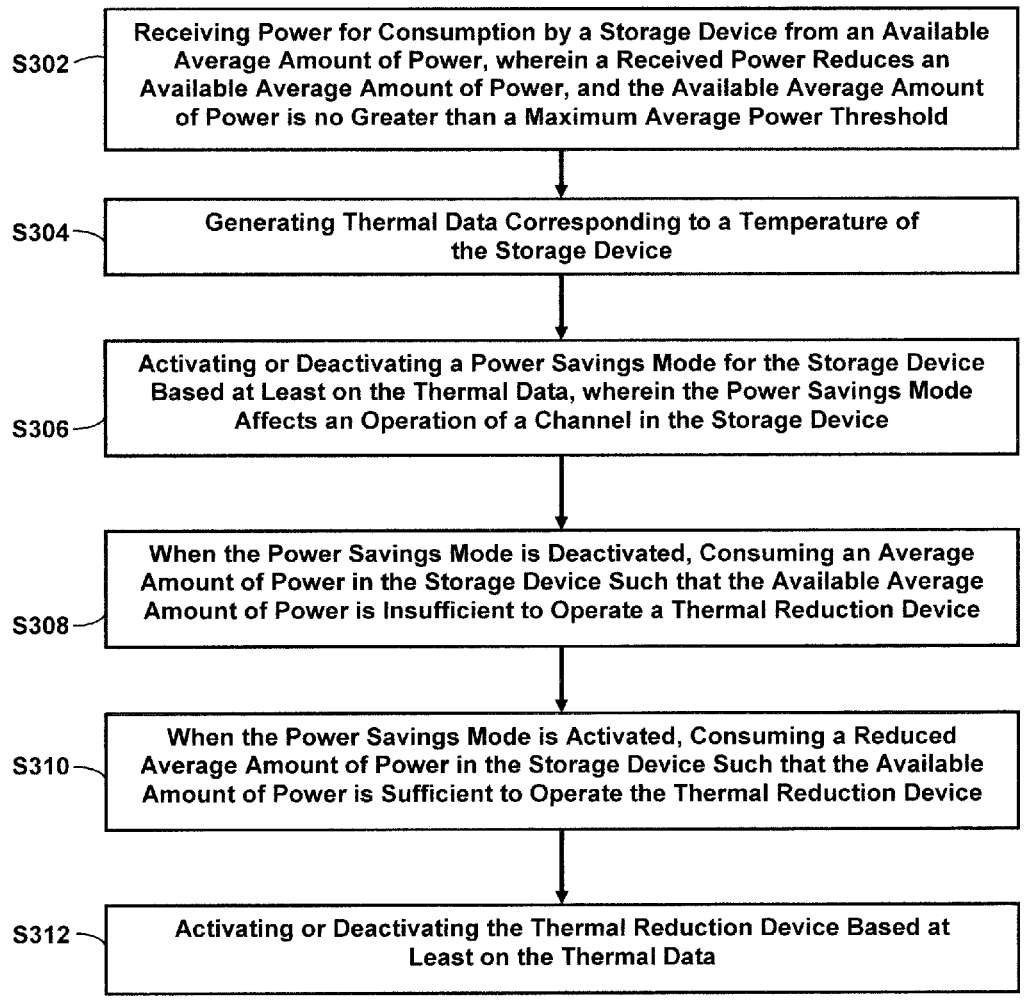
FIG. 3 depicts a process for operating an electronic device comprising a thermal reduction device and a storage device according to an embodiment.

In an embodiment, a process for operating the electronic device 100 comprising the thermal reduction device 104 and the storage device 102 is disclosed in FIG. 3. In block S302, the power input interface 136 receives power for consumption by the storage device 102 from an available average amount of power supplied by the power supply unit 106. In an embodiment, the received power reduces the available average amount of power, and the available average amount of power is no greater than the maximum average power threshold.

In an embodiment, the thermal control unit 118 deactivates the power savings mode when the thermal reduction device 104 is deactivated. In an embodiment, the thermal control unit 118 deactivates the power savings mode only after the thermal reduction device 104 is deactivated and the average power consumed by the thermal reduction device 104 is sufficiently reduced to power the storage device 102 and increase data operations performed by the channel 112 on the media 114.

In the embodiment shown in FIG. 2, the temperature threshold Temp 2 is less than the temperature threshold Temp 1. However, in an embodiment, the temperature threshold Temp 2 may be substantially equal to the temperature threshold Temp 1.

In block S304, the thermal sensor 116 generates thermal data corresponding to a temperature of the storage device 102. In block S306, the thermal control unit 118 activates or deactivates the power savings mode for the storage device 102 based at least on the thermal data. The power savings mode can, for example, affect an operation of the channel 112 in the storage device 102.

In block S308, when the power savings mode is deactivated, the storage device 102 consumes an average amount of power such that the available average amount of power is insufficient to operate the thermal reduction device 104. In block S310, when the power savings mode is activate, the storage device 102 consumes a reduced average amount of power such that the available average amount of power is sufficient to operate the thermal reduction device 104.

In block S312, the thermal control unit 118 activates or deactivates the thermal reduction device 104 based at least on the thermal data.

In an embodiment, the thermal control unit 118 comprises software embodied on a non-transitory machine readable medium, which when operated causes a processer to perform thermal control of the storage device 102 as disclosed in one or more of the embodiments described above. In an embodiment, the thermal control unit 118 comprises a controller configured to perform thermal control of the storage device 102 as disclosed in one or more of the embodiments described above.

Those of ordinary skill would appreciate that the various illustrative logical blocks, modules, and algorithm parts described in connection with the examples disclosed herein may be implemented as electronic hardware, computer software, or combinations of both. Furthermore, the embodiments can also be embodied on a non-transitory machine readable medium causing a processor or computer to perform or execute certain functions.

To clearly illustrate this interchangeability of hardware and software, various illustrative components, blocks, modules, circuits, and process parts have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the disclosed apparatus and methods.

The parts of a method or algorithm described in connection with the examples disclosed herein may be embodied directly in hardware, in a software module executed by a processor, or in a combination of the two. The parts of the method or algorithm may also be performed in an alternate order from those provided in the examples. A software module may reside in RAM memory, flash memory, ROM memory, EPROM memory, EEPROM memory, registers, hard disk, a removable disk, an optical disk, or any other form of storage medium known in the art. An exemplary storage medium is coupled to the processor such that the processor can read information from, and write information to, the storage medium. In the alternative, the storage medium may be integral to the processor. The processor and the storage medium may reside in an Application Specific Integrated Circuit (ASIC).

The previous description of the disclosed examples is provided to enable any person of ordinary skill in the art to make or use the disclosed methods and apparatus. Various modifications to these examples will be readily apparent to those skilled in the art, and the principles defined herein may be applied to other examples without departing from the spirit or scope of the disclosed method and apparatus. The described embodiments are to be considered in all respects only as illustrative and not restrictive and the scope of the disclosure is, therefore, indicated by the appended claims rather than by the foregoing description. All changes which come within the meaning and range of equivalency of the claims are to be embraced within their scope.

What is claimed is:

1. An electronic device comprising:
    a thermal reduction device; and
    a storage device electrically connected to the thermal reduction device comprising:
        a media;
        a channel configured to perform data operations on the media;
        a power input interface configured to receive power for consumption by the storage device from an available average amount of power, wherein the received power reduces the available average amount of power, and the available average amount of power is no greater than a maximum average power threshold;
        a thermal sensor configured to generate thermal data corresponding to a temperature of the storage device; and
        a thermal control unit configured to activate or deactivate a power savings mode for the storage device based at least on the thermal data, and to activate or deactivate the thermal reduction device based at least on the thermal data,
            wherein the power savings mode affects an operation of the channel,
            when the power savings mode is deactivated, the storage device is configured to consume an average amount of power such that the available average amount of power is insufficient to operate the thermal reduction device, and
            when the power savings mode is activated, the storage device is configured to consume a reduced average amount of power such that the available average amount of power is sufficient to operate the thermal reduction device;
            wherein the storage device is configured to consume a first average amount of power when the power savings mode is deactivated and to consume a second average amount of power when the power savings mode is activated, wherein the second average amount of power is less than the first average amount of power.

2. The electronic device of claim 1 wherein the thermal control unit is further configured to activate the power savings mode based at least on the thermal data, to activate the thermal reduction device when the power savings mode is activated, to deactivate the thermal reduction device based at least on the thermal data, and to deactivate the power savings mode when the thermal reduction device is deactivated.

3. The electronic device of claim 2 wherein the thermal control unit is further configured to activate the power savings mode based on a comparison of the thermal data and a first predetermined temperature threshold and to deactivate the thermal reduction device based on a comparison of the thermal data and a second predetermined temperature threshold.

4. The electronic device of claim 1 further comprising a power switch connected between the storage device and the thermal reduction device and configured to enable and disable power to the thermal reduction device, wherein the thermal control unit is further configured to activate the thermal reduction device by instructing the power switch to enable power to the thermal reduction device and to deactivate the thermal reduction device by instructing the power switch to disable power to the thermal reduction device.

5. The electronic device of claim 4 wherein the power switch comprises a transistor.

6. The electronic device of claim 1 wherein the thermal reduction device is further configured to consume a third average amount of power when the thermal reduction device is activated, and a sum of the second average amount of power and the third average amount of power is no greater than the first average amount of power.

7. The electronic device of claim 1 wherein when the power savings mode is deactivated, the channel is configured to perform a first average amount of data operations on the media, and when the power savings mode is activated, the channel is configured to perform a second average amount of data operations on the media, wherein the second average amount of data operations is less than the first average amount of data operations.

8. The electronic device of claim 7 wherein the second average amount of data operations is based on an average amount of power consumed by the thermal reduction device.

9. The electronic device of claim 1 wherein the media comprises at least one of a magnetic rotating disk and a solid state memory.

10. A method for operating an electronic device comprising a thermal reduction device and a storage device electrically connected to a thermal reduction device, the method comprising at least:
    receiving power for consumption by the storage device from an available average amount of power, wherein the received power reduces the available average amount of power, and the available average amount of power is no greater than a maximum average power threshold;
    generating thermal data corresponding to a temperature of the storage device;
    activating or deactivating a power savings mode for the storage device based at least on the thermal data, wherein the power savings mode affects an operation of a channel in the storage device;
    when the power savings mode is deactivated, consuming an average amount of power in the storage device such that the available average amount of power is insufficient to operate the thermal reduction device;

when the power savings mode is activated, consuming a reduced average amount of power in the storage device such that the available average amount of power is sufficient to operate the thermal reduction device;

activating or deactivating the thermal reduction device based at least on the thermal data;

when the power savings mode is deactivated, consuming a first average amount of power in the storage device; and when the power savings mode is activated, consuming a second average amount of power in the storage device, wherein the second average amount of power is less than the first average amount of power.

11. The method of claim 10 further comprising:
activating the power savings mode based at least on the thermal data;
activating the thermal reduction device when the power savings mode is activated;
deactivating the thermal reduction device based at least on the thermal data; and
deactivating the power savings mode when the thermal reduction device is deactivated.

12. The method of claim 11 further comprising:
activating the power savings mode based on a comparison of the thermal data and a first predetermined temperature threshold; and
deactivating the thermal reduction device based on a comparison of the thermal data and a second predetermined temperature threshold.

13. The method of claim 10 further comprising:
activating the thermal reduction device by instructing a power switch connected between the storage device and the thermal reduction device to enable power to the thermal reduction device; and
deactivating the thermal reduction device by instructing the power switch to disable power to the thermal reduction device.

14. The method of claim 13 wherein the power switch comprises a transistor.

15. The method of claim 10 further comprising:
when the thermal reduction device is activated, consuming a third average amount of power in the thermal reduction device, wherein a sum of the second average amount of power and the third average amount of power is no greater than the first average amount of power.

16. The method of claim 10 further comprising:
when the power savings mode is deactivated, performing a first average amount of data operations on a media in the storage device using the channel; and
when the power savings mode is activated, performing a second average amount of data operations on the media using the channel, wherein the second average amount of data operations is less than the first average amount of data operations.

17. The method of claim 16 wherein the second average amount of data operations is based on an average amount of power consumed by the thermal reduction device.

18. The method of claim 16 wherein the media comprises at least one of a magnetic rotating disk and a solid state memory.

19. A storage device configured to electrically connect to a thermal reduction device comprising:
a media;
a thermal sensor configured to generate thermal data corresponding to a temperature of the storage device;
a thermal control unit configured to activate or deactivate a power savings mode for the storage device based at least on the thermal data, and to activate or deactivate the thermal reduction device based at least on the thermal data,
when the power savings mode is deactivated, the storage device is configured to consume an average amount of power such that an available average amount of power is insufficient to operate the thermal reduction device, and
when the power savings mode is activated, the storage device is configured to consume a reduced average amount of power such that the available average amount of power is sufficient to operate the thermal reduction device; and
a channel configured to perform data operations on the media, wherein when the power savings mode is deactivated, the channel is configured to perform a first average amount of data operations on the media, and when the power savings mode is activated, the channel is configured to perform a second average amount of data operations on the media, wherein the second average amount of data operations is less than the first average amount of data operations, and the second average amount of data operations is based on an average amount of power consumed by the thermal reduction device.

20. The storage device of claim 19 wherein the thermal control unit is further configured to activate the power savings mode based at least on the thermal data, to activate the thermal reduction device when the power savings mode is activated, to deactivate the thermal reduction device based at least on the thermal data, and to deactivate the power savings mode when the thermal reduction device is deactivated.

* * * * *